United States Patent [19]

Awano

[11] Patent Number: 4,564,837
[45] Date of Patent: Jan. 14, 1986

[54] CIRCUIT FOR MONITORING THE FREQUENCY OF SIGNAL FOR CONTROLLING CHOPPERS OF ELECTRIC CARS

[75] Inventor: Toshiaki Awano, Hyogo, Japan

[73] Assignee: Mitsubishi Denki Kabushiki Kaisha, Tokyo, Japan

[21] Appl. No.: 455,127

[22] Filed: Jan. 3, 1983

[51] Int. Cl.[4] .................. H04Q 9/00; H03K 7/06; G08B 21/00
[52] U.S. Cl. .................. 340/825.3; 340/658; 328/133; 307/526
[58] Field of Search ............... 340/825.3, 658, 825.71; 328/133, 134, 160; 324/83 D, 79 D; 307/526

[56] References Cited

U.S. PATENT DOCUMENTS

| | | | |
|---|---|---|---|
| 3,971,994 | 7/1976 | Sheperd | 328/133 |
| 4,002,314 | 1/1977 | Barpal | 340/825.71 |
| 4,417,229 | 11/1983 | Wilson | 340/658 |
| 4,442,406 | 4/1984 | Voss | 328/134 |
| 4,465,977 | 8/1984 | Romana | 328/133 |

Primary Examiner—Donald J. Yusko
Attorney, Agent, or Firm—Bernard, Rothwell & Brown

[57] ABSTRACT

A circuit is disclosed for monitoring the frequency of a signal for controlling choppers of electric cars. The phase of the control signal is compared by a comparator with the phase of a reference frequency signal produced by a reference-frequency signal generator. When the phase difference which is greater than a predetermined value is sustained continuously for more than a predetermined period of time, an alarm is produced.

4 Claims, 2 Drawing Figures

CIRCUIT FOR MONITORING THE FREQUENCY OF SIGNAL FOR CONTROLLING CHOPPERS OF ELECTRIC CARS

FIELD OF THE INVENTION

The present invention relates to a circuit for monitoring the frequency of output signal produced by a signal generator, and more specifically to a circuit for monitoring the frequency deviation of a chopper control signal supplied to chopper controllers of electric cars.

BACKGROUND OF THE INVENTION

In the chopper controllers of electric cars, high-frequency electric currents generated by the chopping operation cause an effect as a noise source for several kinds of traffic signal equipment. Therefore, it is desirable that the chopping frequency be selected such that it and its harmonics do not fall within the frequency region of the signal of such equipment. However, the frequency of chopper control signal to be supplied to the chopper controller may change or deviate due to some causes, such as an abnormal condition developed in the oscillator circuit that generates the chopper control signal. If such a frequency deviation causes the higher harmonics of the chopping frequency to fall within the frequency region of the traffic signals that are being used for the signal equipment, the chopping frequency having large energy is interrupted into the signal equipment to cause them to operate erroneously. Such a state should, therefore, be detected quickly. Namely, means should be provided which monitors the frequency of the chopper control signal, and which produces an alarm in case the frequency deviates by more than a predetermined value.

SUMMARY OF THE INVENTION

The object of the present invention, therefore, is to provide a monitoring circuit which monitors the frequency of the chopper control signal, and which produces an alarm when the frequency deviates by more than a predetermined value for more than a predetermined period of time.

Another object of the present invnetion is to provide a monitoring circuit which monitors any abnormal operation that may develop in the circuit which generates the chopper control signal.

Namely, according to the present invention, the chopper control signal supplied to a chopper controller of an electric car are sent to a comparator together with a reference-pulse signal that is generated by a reference-frequency signal generator, so that their phases are compared with each other. When the phase difference which is greater than a predetermined value is detected continuously for a predetermined period of time, the comparator generates an error signal of a high or a low logic level according to the leading or the lagging of phase difference to issue an alarm.

DESCRIPTION OF THE PREFERRED EMBODIMENT

Figure 1:
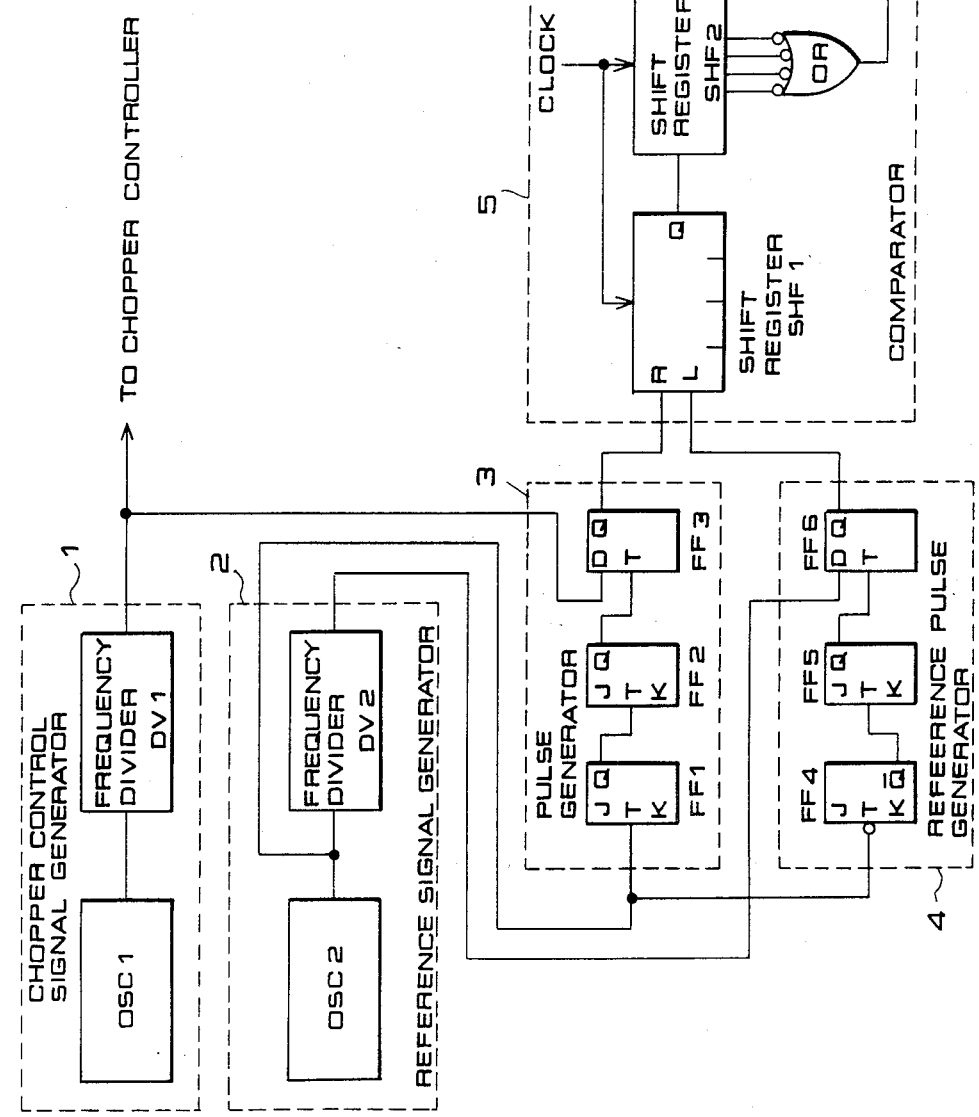
FIG. 1 is a block diagram of a circuit for monitoring chopper control signals according to the present invention.

FIG. 1 illustrates a circuit according to the present invention, in which chopper control signals to be monitored are produced by a chopper control signal generator 1, and are supplied to a chopper controller which is not shown and to a circuit of the preset invention which will be mentioned later. Preferably, the signal generator 1 consists of an oscillator OSC1 that is controlled by a quartz oscillator device, and a frequency divider DV1 which divides the frequency of the signal generated by the oscillator OSC1. The outputs of the frequency divider DV1 serve as a chopper control signal.

Provision is further made of a reference frequency signal generator 2 which has an oscillator OSC2 and a frequency divider DV2, that are constructed in the same manner as the oscillator OSC1 and the frequency divider DV1 respectively. An output of the oscillator OSC2 is supplied to a pulse generator 3, and an output of the frequency divider DV2 is supplied to a reference pulse generator 4. The pulse generator 3 includes flip-flops FF1 and FF2 that are connected in cascade for dividing the frequency of the output signal produced by the oscillator OSC2, and a flip-flop FF3 which receives the output of the flip-flop FF2 at a clock input T and which receives the output of the frequency divider DV1 at a data input D. The output of the oscillator OSC2 is further input to a flip-flop FF4 of the reference pulse generator 4 for dividing the frequency thereof. An output $\overline{Q}$ of the flip-flop FF4 is sent to a clock input T of a flip-flop FF5. An output Q of the flip-flop FF5 is sent to a clock input T of a D-type flip-flop FF6 of which a data input D is connected to the output terminl of the frequency divider DV2. The output Q of the flip-flop circuit FF6 corresponds to the output of the reference pulse generator 4 and is sent to a comparator 5.

The comparator 5 consists of a four-stage shift register SHF1 which receives the output Q of the flip-flop FF3 at a right shift input R, and the output Q of the flip-flop FF6 at a left shift input L for respectively introducing the logic levels 1 and 0 in a shifting manner, an eight-stage shift register SHF2 which introduces the output Q from the final stage of the register SHF1 in a shifting manner with the clocking of a clock signal, and an OR gate OR which is connected to outputs of each of the preselected stages, such as odd or even stages of the shift register SHF2. An output of the OR is sent to the base of a transistor TR of an alarm circuit 6.

The alarm circuit 6 consists of a transistor TR that operates as as emitter-grounded amplifier, the collector thereof being connected to a transformer TF that serves as a load, and the base thereof being connected to the output of the OR gate, a rectifier REC for rectifying the secondary output of the transformer TF, and a relay RLY which is actuated by the d-c output signal sent from the rectifier REC.

Figure 2:
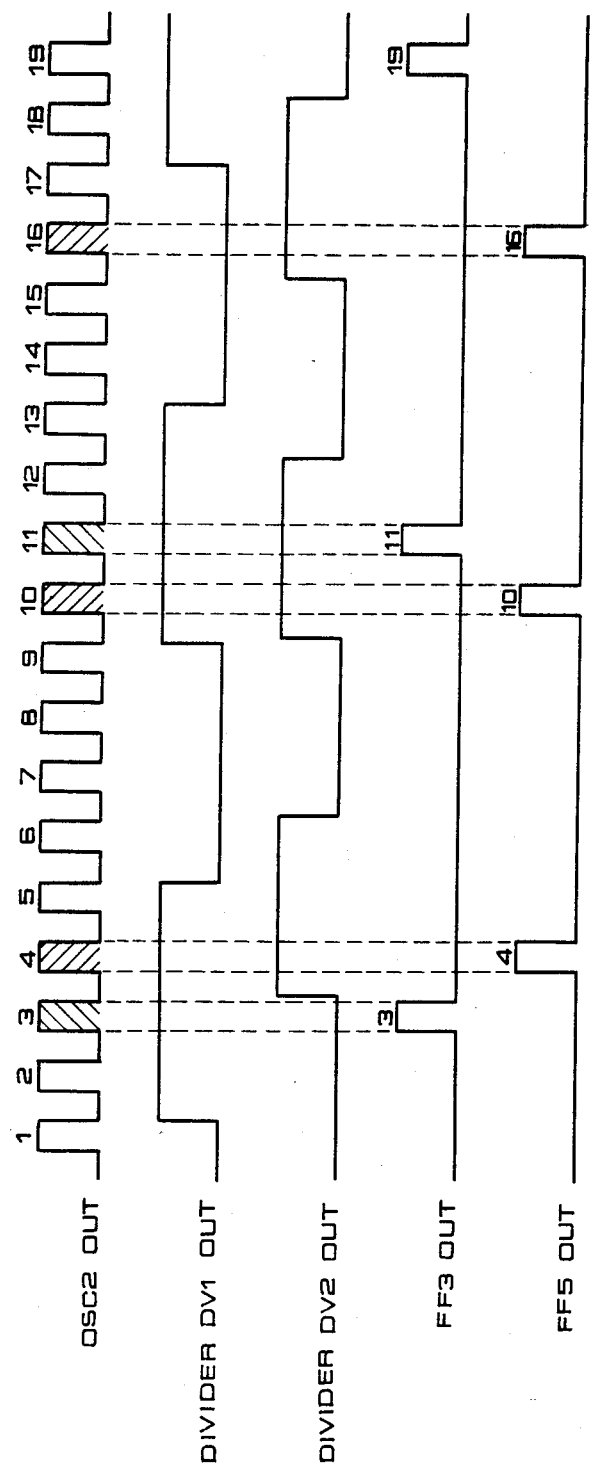
FIG. 2 is a diagram which illustrates operation timings of the circuit shown in FIG. 1.

In operation, when each of the portions of the circuit operates normally, as illustrated in FIG. 2, the oscillator OSC2 generates the frequency reference signal in the form of a continuous pulse train, and the frequency divider DV1 sends a frequency-divided output to the input D of the flip-flop FF3, the frequency-divided output being rendered to assume a high level during the second to fifth pulse of the reference signal, and being rendered to assume a low level during the sixth to ninth pulse of the ninth reference signal. With such arrangements, provision is further made that the flip-flop FF3 generates a compare signal only responsive to the third pulse of the reference signal. The compare signal is thereafter produced after every eighth pulse of the reference signal, i.e., produced at the 11th, 19th pulse etc., whereby the shift register SHF1 introduces logic level 1 in a shifting manner with the activation of the right shift input R.

On the other hand, the flip-flop FF6 of the reference pulse generator 4 introduces, via its data input D, the outputs of the frequency divider DV2 for sampling the output Q of the flip-flop circuit FF5 to generate pulses which respectively coincide with the fourth, tenth and sixteenth pulse of the reference signal, so that the shift register SHF1 introduces logic level 0 in a shifting manner with the activation of the left shift input L. Since the right shift and left shift take place alternately, the shift register SHF1 provides a signal to the shift register SHF2, which changes between high and low level alternately. Therefore, all output digits of the shift register SHF2 are simultaneously rendered to be 1 or 0 to allow pulses to generate from the OR gate. The pulses are then amplified by the transistor TR, and are in turn supplied to the rectifier REC via the transformer TF. The resulting d-c signal from the rectifier then energizes the relay RLY. So long as the relay RLY is being energized for holding the NC contact (not shown) open, no alarm is produced.

However, in case an abnormal condition develops in the oscillator OSC1 as the oscillation frequency becomes greater than a nominal frequency, the right shift input R of the shift register SHF1 is continuously activated, or is activated for longer time than the left shift input L, so that the shift register SHF1 continues shifting toward the right. Accordingly, the output Q of the shift register SHF1 is allowed to keep high level so that the OR gate receives all high level inputs for holding the transistor TR in the conductive state, and the rectifier REC produces the outputs of low level. The relay RLY therefore is de-energized to close the NC contact, and thus the alarm is produced.

As will be obvious from the above description, an unequal number of pulses supplied from the right shift input R and the left shift input L of the shift register SHF1 will cause the shift register SHF2 continuously to produce an output of either high or low level. Such a condition also occurs when the oscillation frequency of the oscillator OSC1 deviates from the nominal frequency, when the oscillation frequency of the oscillator OSC2 deviates from its nominal frequency and/or when any circuit connected to the shift register SHF1 is broken.

What is claimed is:

1. A circuit for monitoring the frequency of signal for controlling choppers of electric cars, comprising:
    means for generating a reference frequency signal which has a frequency which is an integer number of times that of said chopper control signal;
    means for generating a compare pulse signal responsive to the logical product between said reference frequency signal and said chopper control signal;
    means which divides the frequency of said reference frequency signal to generate a reference pulse signal of a nominal frequency for producing said chopper control signal;
    means which compares the phase between said compare pulse signal and said reference pulse signal to produce an error signal of a predetermined logic level when the phase difference between the two pulse signals becomes greater than a predetermined value;
    said comparator means comprising a first shift register having a plurality of stages which introduces one logic level that is shifted in one direction responsive to said compare pulse signal, and which introduces another logic level that is shifted in another direction responsive to said reference pulse signal, and gate means which produces the error signal when the output of the shift register continuously remains in a predetermined logic level for a predetermined period of time; and
    means for producing an alarm responsive to said error signal generated by said comparator means.

2. A monitoring circuit according to claim 1, wherein said gate means comprises an OR gate which becomes active when all inputs of preselected stages from said first shift register assume the same logic level.

3. A monitoring circuit according to claim 1, wherein said comparator means further comprises:
    a second shift register connected to said first shift register and having a plurality of stages, which introduces an output of said second shift register that is shifted in one direction; and
    said gate means produces the error signal in response to received preselected outputs having the same logic level as the stages of said second shift register.

4. A monitoring circuit according to claim 1, 2 or 3, wherein the compare pulse generating means comprises a flip-flop circuit which receives said reference frequency signal at the clock input, and the chopper control signal at the data input.

* * * * *